United States Patent [19]
Villa et al.

[11] Patent Number: 5,854,764
[45] Date of Patent: Dec. 29, 1998

[54] SECTORIZED ELECTRICALLY ERASABLE AND PROGRAMMABLE NON-VOLATILE MEMORY DEVICE WITH REDUNDANCY

[75] Inventors: Corrado Villa; Marco Dallabora; Fabio Tassan Caser, all of Milan, Italy

[73] Assignee: SGS-Thomson Microelectronics, S.r.l., Agrate Brianza, Italy

[21] Appl. No.: 821,804

[22] Filed: Mar. 21, 1997

[30] Foreign Application Priority Data

Mar. 22, 1996 [EP] European Pat. Off. .............. 96830144

[51] Int. Cl.⁶ ........................... G11C 15/00; G11C 13/00
[52] U.S. Cl. .............................................. 361/200; 365/45
[58] Field of Search ......................... 365/49, 200, 230.01

[56] References Cited

U.S. PATENT DOCUMENTS

| | | | |
|---|---|---|---|
| 5,347,484 | 9/1994 | Kwong et al. | 365/49 |
| 5,667,883 | 10/1997 | Miwa | 365/200 |

FOREIGN PATENT DOCUMENTS

| | | | |
|---|---|---|---|
| 0 618 587 | 10/1994 | European Pat. Off. | G11C 11/00 |
| 0 640 918 | 3/1995 | European Pat. Off. | G06F 11/20 |
| 0 668 562 | 8/1995 | European Pat. Off. | G06F 11/20 |

*Primary Examiner*—Terrell W. Fears
*Attorney, Agent, or Firm*—David V. Carlson; Robert Iannucci; Seed and Berry LLP

[57] ABSTRACT

A sectorized electrically erasable and programmable non-volatile memory device comprises: a plurality of individually-addressable memory sectors, each memory sector comprising an array of memory cells arranged in rows and columns; redundancy columns of redundancy memory cells for replacing defective columns of memory cells; and a redundancy control circuit for storing addresses of the defective columns and activating respective redundancy columns when said defective columns are addressed. Each memory sector comprises at least one respective redundancy column. The redundancy control circuit comprises at least one memory means comprising individually addressable memory locations each one associated with a respective memory sector for storing, individually for each memory sector, addresses of a defective column belonging to the memory sector, and an address recognition means associated with said memory means for recognizing if a current address supplied to the memory device coincides with a defective column address stored in an addressed one of said memory locations associated with a currently addressed memory sector.

21 Claims, 7 Drawing Sheets

SECTORIZED ELECTRICALLY ERASABLE AND PROGRAMMABLE NON-VOLATILE MEMORY DEVICE WITH REDUNDANCY

TECHNICAL FIELD

The present invention relates to a sectorized electrically erasable and programmable non-volatile memory device with redundancy, particularly to a Flash EEPROM.

BACKGROUND OF THE INVENTION

It is known that Flash EEPROMs, like EEPROMs, are electrically erasable memory devices. However, Flash EEPROMs are characterized by higher integration densities (memory cells per unit area of the chip), comparable with those achievable in UV-erasable EPROMs. This feature is achieved by renouncing to the possibility of erasing the memory device at single bytes at a time, a typical feature of EEPROMs: Flash EEPROMs, like EPROMs, are "bulk erasable" devices wherein the erase operation involves all the memory cells at a time.

To limit the drawbacks of the bulk erase feature and increase the flexibility of the memory device, Flash EEPROMs (at least those with large memory size) are "sectorized", i.e., the array of memory cells is divided in a plurality of memory sectors which can be individually erased independently from each other. The memory sectors form independent memory areas; during reading, only one memory sector is addressed at a time.

The arrangement of the array of memory cells in independent memory sectors affects the architecture of redundancy.

As known, redundancy is the complex of circuits and additional memory elements provided in a memory device to "repair" defective memory elements: by means of redundancy, a memory device affected by at most a limited number of defects can be recovered.

Redundancy memory elements are memory cells identical to the memory cells of the memory array, arranged in rows (redundancy row) or columns (redundancy columns). The redundancy circuits control the selection of a given redundancy row or redundancy column in substitution for a row or column of the memory array in which at least one defective memory cell is detected; to this purpose, the redundancy circuits store the addresses of the rows or columns containing defective memory cells, so that when the defective rows or columns are accessed (during reading or programming) they are not selected, and the corresponding redundancy memory elements are selected. The functional substitution of defective rows or columns with redundancy ones is performed during in-factory testing of the memory device, and is normally transparent to the end user.

The provision of redundancy in a memory device clearly has a cost in terms of chip area; the number of redundancy memory elements (redundancy rows or columns) to be provided must be evaluated on the basis of the overall yield, taking into account the defectivity of the manufacturing process and the number of defective memory device chips which can be recovered.

As previously mentioned, the presence of independent memory sectors in a Flash EEPROM affects the redundancy architecture.

SUMMARY OF THE INVENTION

Accordingly, it is an object of the present invention to provide a sectorized electrically erasable and programmable non-volatile memory device with redundancy.

According to the present invention, such object is achieved by means of a sectorized electrically erasable and programmable non-volatile memory device, comprising a plurality of individually-addressable memory sectors, each memory sector comprising an array of memory cells arranged in rows and columns, redundancy columns of redundancy memory cells for replacing defective columns of memory cells, and a redundancy control circuit for storing addresses of the defective columns and activating respective redundancy columns when said defective columns are addressed, characterized in that each memory sector comprises at least one respective redundancy column and in that said redundancy control circuit comprises at least one memory means comprising individually addressable memory locations each one associated with a respective memory sector for storing, individually for each memory sector, addresses of a defective column belonging to the memory sector, and an address recognition means associated with said memory means for recognizing if a current address supplied to the memory device coincides with a defective column address stored in an addressed one of said memory locations associated with a currently addressed memory sector.

Thanks to the present invention, it is possible to substitute a defective column belonging to a given memory sector with a redundancy column associated with said sector, independently from the other memory sectors of the memory device.

BRIEF DESCRIPTION OF THE DRAWINGS

These and other features and advantages of the present invention will be made apparent from the following detailed description of a particular embodiment, described as a non-limiting example in the annexed drawings, wherein.

DETAILED DESCRIPTION OF THE INVENTION

Figure 1:
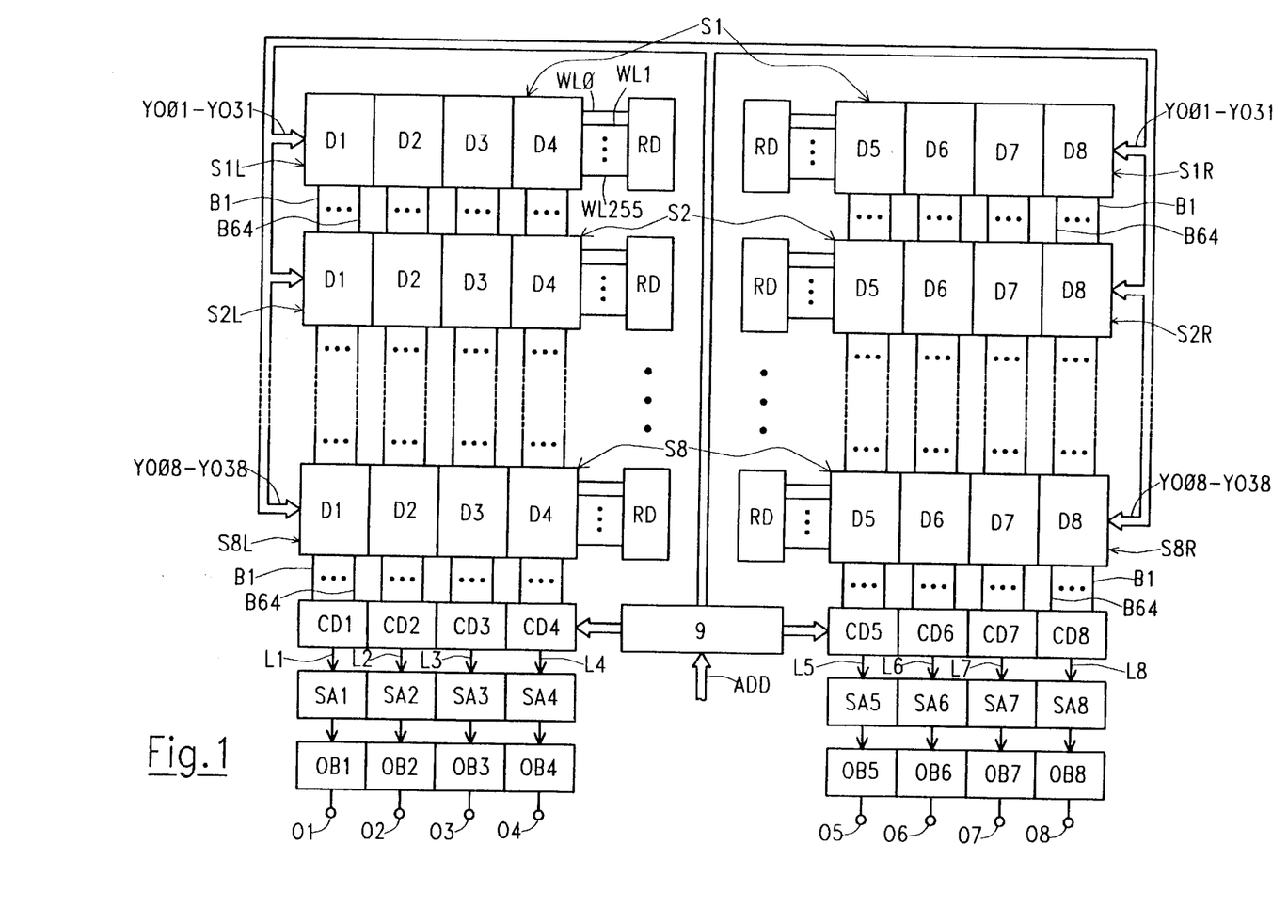
FIG. 1 is a schematic block diagram of a sectorized Flash EEPROM with redundancy according to the present invention.

Referring to FIG. 1, a Flash EEPROM according to the present invention is shown comprising a plurality (eight in the shown example) of independent, individually erasable memory sectors S1–S8. The memory sectors S1–S8 can have equal size, but they could as well have different sizes from each other. Supposing for example that the Flash EEPROM is a 4 Mbit device with eight output data lines (i.e., a 512 KByte memory) and that the memory sectors S1–S8 have equal size, each memory sector has a size of 512 Kbit.

The memory sectors S1–S8 are divided in two parts, namely a left side S1L–S8L and a right side S1R–S8R. As will be better explained in the following, each side of each memory sector includes 256K memory cells located at the intersections of rows (word lines) WL0–WL255 and columns (bit lines). Associated with each side of each memory sector is a respective row decoder RD for selecting one word line among the 256 available. The division of the memory sectors in two sides, each side with its row decoder, allows to keep the length of the word lines sufficiently short not to cause an unacceptable increase of the access time of the memory device.

Each memory sector S1–S8 is divided into eight portions D1–D8 of the same size (64 Kbit), each portion corresponding to the memory space reserved to a respective output data line of the memory device. The left side S1L–S8L of each memory sector includes the first four portions D1–D4, corresponding to the four least significant bits of the eight output data lines; the right side S1R–S8R of the memory sectors includes the remaining four portions D5–D8, corresponding to the four most significant bits of the eight output data lines.

Figure 2:
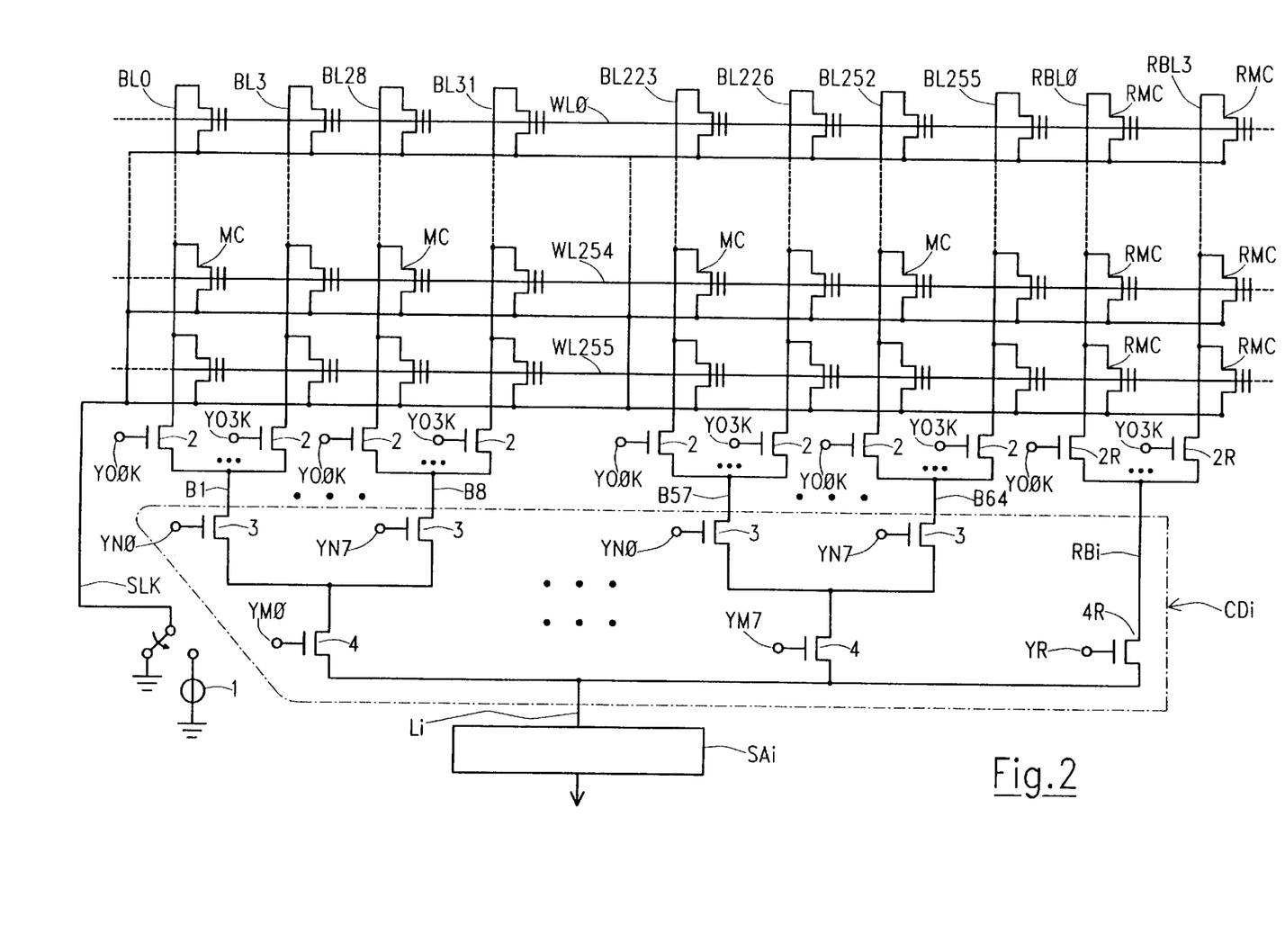
FIG. 2 is a schematic circuit diagram of a column decoding architecture of the Flash EEPROM of FIG. 1.

As visible in FIG. 2, showing in detail the structure of a portion Di (i=1 . . . 8) of a given memory sector Sk (k=1 . . . 8), each portion Di includes 256 bit lines BL0–BL255. The memory cells MC are represented by floating-gate MOS transistor each having a control-gate electrode connected to a respective word line (one among the 256 word lines WL0–WL255), a drain electrode connected to a respective bit line (one among the 256 bit lines BL0–BL255), and a source electrode connected in common with the source electrodes of all the other memory cells MC of the memory sector Sk to a switchable source line SLk (which can be switched between ground and an erase source voltage supply 1). Inside each portion Di, the bit lines BL0–BL255 are grouped together in groups of four, each group being coupled to a respective second-level bit line B1–B64; first-level selection transistors 2, driven by respective first-level selection signals Y00k–Y03k, allow the selection of one bit line BL0–BL255 inside each group, so that the selected bit line BL0–BL255 can be electrically connected to the respective second-level bit line B1–B64. As visible in FIG. 1, the second-level bit lines B1–B64 of a given portion Di of a given memory sector Sk are common to all the portions Di of the other memory sectors. An array of eight column decoders CDi (i=1 . . . 8) (a given column decoder CDi being associated with the portions Di of all the eight memory sectors S1–S8) allow to select one of the 64 second-level bit lines B1–B64, multiplexing the 64 second-level bit lines B1–B64 into a single line Li (i=1 . . . 8). As shown in FIG. 2, the second-level bit lines B1–B64 are grouped together in groups of eight. Each column decoder CDi comprises eight groups of eight second-level selection transistors 3, driven by second-level selection signals YN0–YN7 (common to all the memory sectors) and allowing the selection of one of the second-level bit lines B1–B64 within each group of eight, and eight third-level selection transistors 4, driven by third-level selection signals YM0–YM7 (also common to all the memory sectors) and allowing the selection of one of the eight groups of eight second-level bit lines B1–B64.

Each column decoder CDi supplies a respective sense amplifier SAi (i=1 . . . 8), and each sense amplifier SAi supplies in turn a respective output buffer OBi (i=1 . . . 8) which drives a respective output data line Oi (i=1 . . . 8).

The first-, second- and third-level selection signals Y00k–Y03k (k=1 . . . 8), YN0–YN7 and YM0–YM7 are generated by a decoding circuit 9 supplied with an address signal bus ADD. The generation of the first-, second- and third-selection signals will be explained in further detail later on.

When the memory device is accessed in read or program mode, eight bit lines will be simultaneously selected, one bit line for each one of the eight portions D1–D8 of the currently addressed memory sector.

As further shown in FIG. 2, associated with each portion Di of each memory sector Sk are four columns of redundancy memory cells RMC (redundancy bit lines RBL0–RBL3), identical to the memory cells MC. Four first-level redundancy selection transistors 2R, driven by the four first-level selection signals Y00k–Y03k, allow the selection of one of the four redundancy bit lines RBL0–RBL3, electrically connecting the selected redundancy bit line to a second-level redundancy bit line RBi (i=1 . . . 8); the second-level redundancy bit line RBi of a given portion Di of a given memory sector is common to all the portions Di of the other memory sectors. In the column decoder CDi, a second-level redundancy selection transistor 4R, driven by a second-level redundancy selection signal YR (common to all the memory sectors), allows to electrically connect the second-level redundancy bit-line RBi to the sense amplifier SAi associated with the portion Di. It should be noted that the redundancy memory cells RMC do not have the source electrodes connected to the common source line SLk of the memory sector Sk in one embodiment. However, in a second embodiment, the source electrodes of the redundant memory cells, RMC, are connected to the common source line SLk.

Figure 3:
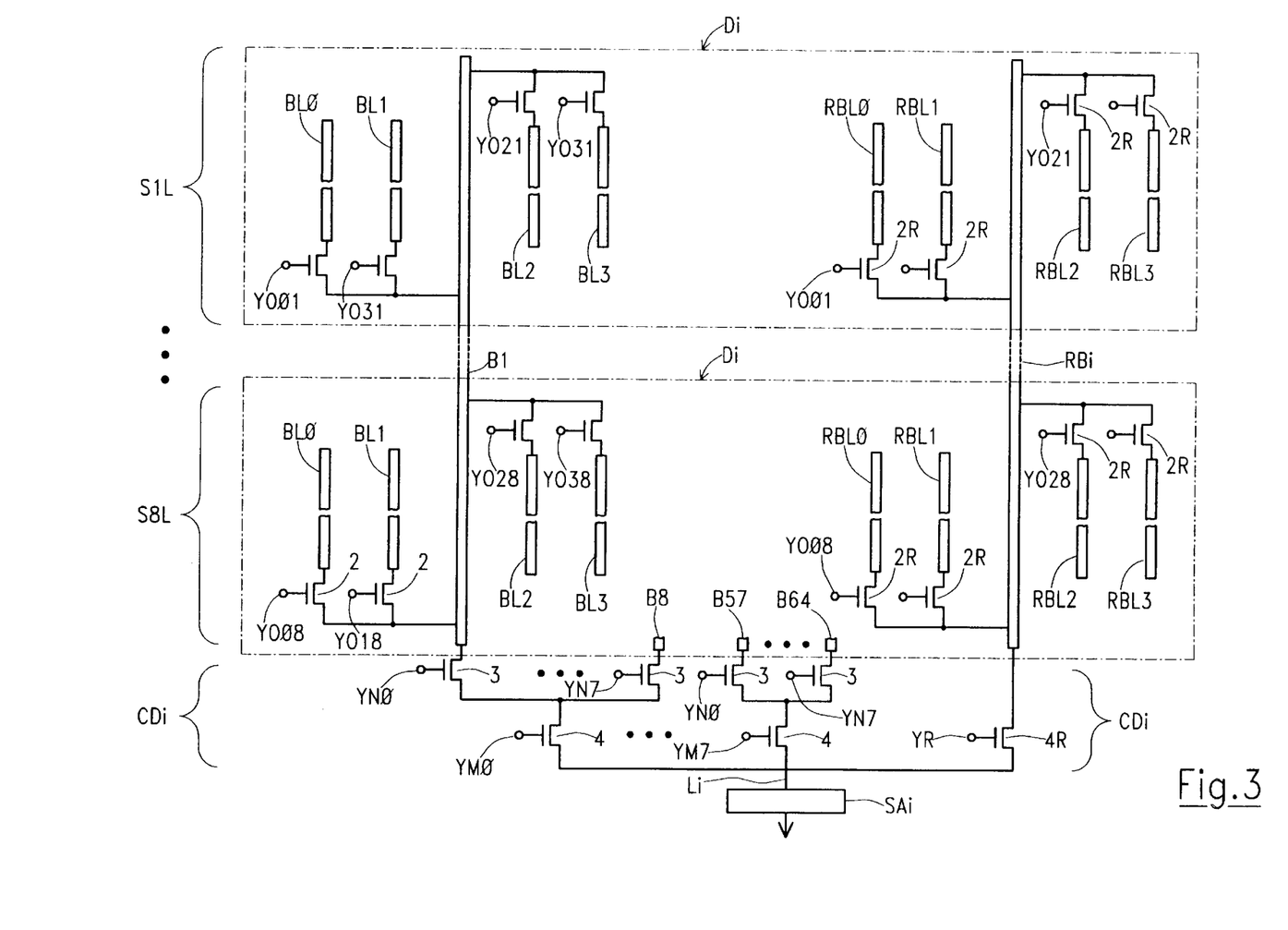
FIG. 3 shows the schematic physical structure of the column decoding architecture shown in FIG. 2.

FIG. 3 schematically shows the physical structure of the bit lines and second-level bit lines. Bit lines BL0–BL255 and redundancy bit lines RBL0–RBL3 are local to each portion Di (i.e., the bit lines and the redundancy bit lines of a given portion Di of a given sector are physically distinct from the bit lines and the redundancy bit lines of the portions Di of the other memory sectors), and are for example formed by means of strips of a first-level interconnection layer (for example, in a double metal layer manufacturing process, they are formed by strips of the first-level metal layer). The second-level bit lines B1–B64 and the second level redundancy bit line RBi of a given portion Di of a given memory sector are instead common to all the portions Di of the other memory sectors, and are for example formed by means of strips of a second-level interconnection layer (in a double metal layer process, they are formed by strips of the second-level metal layer).

Figure 4:
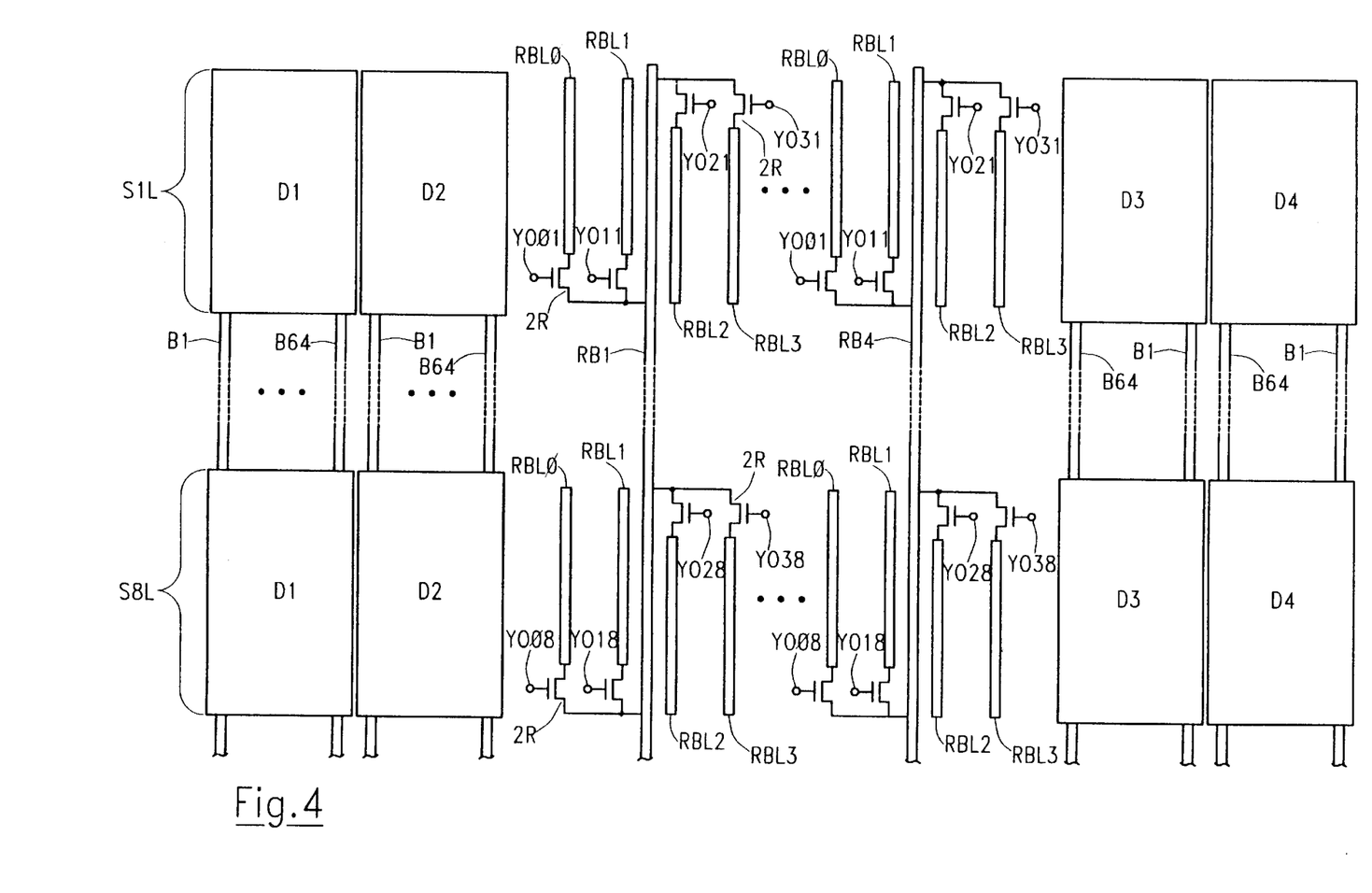
FIG. 4 is a schematic physical layout of a portion of the Flash EEPROM shown in FIG. 1.

FIG. 4 schematically illustrates the physical arrangement of the redundancy bit lines inside a memory sector. In this figure, only the left side of the memory sectors is shown, the right side being symmetrical. The sixteen redundancy bit lines (four local redundancy bit lines RBL0–RBL3 for each one of the four portions D1–D4 in the left side of the memory sectors) are located between the portions D2 and D3 of each memory sector S1–S8. In the overall, 256 redundancy bit lines are provided in the memory device.

Figure 5:
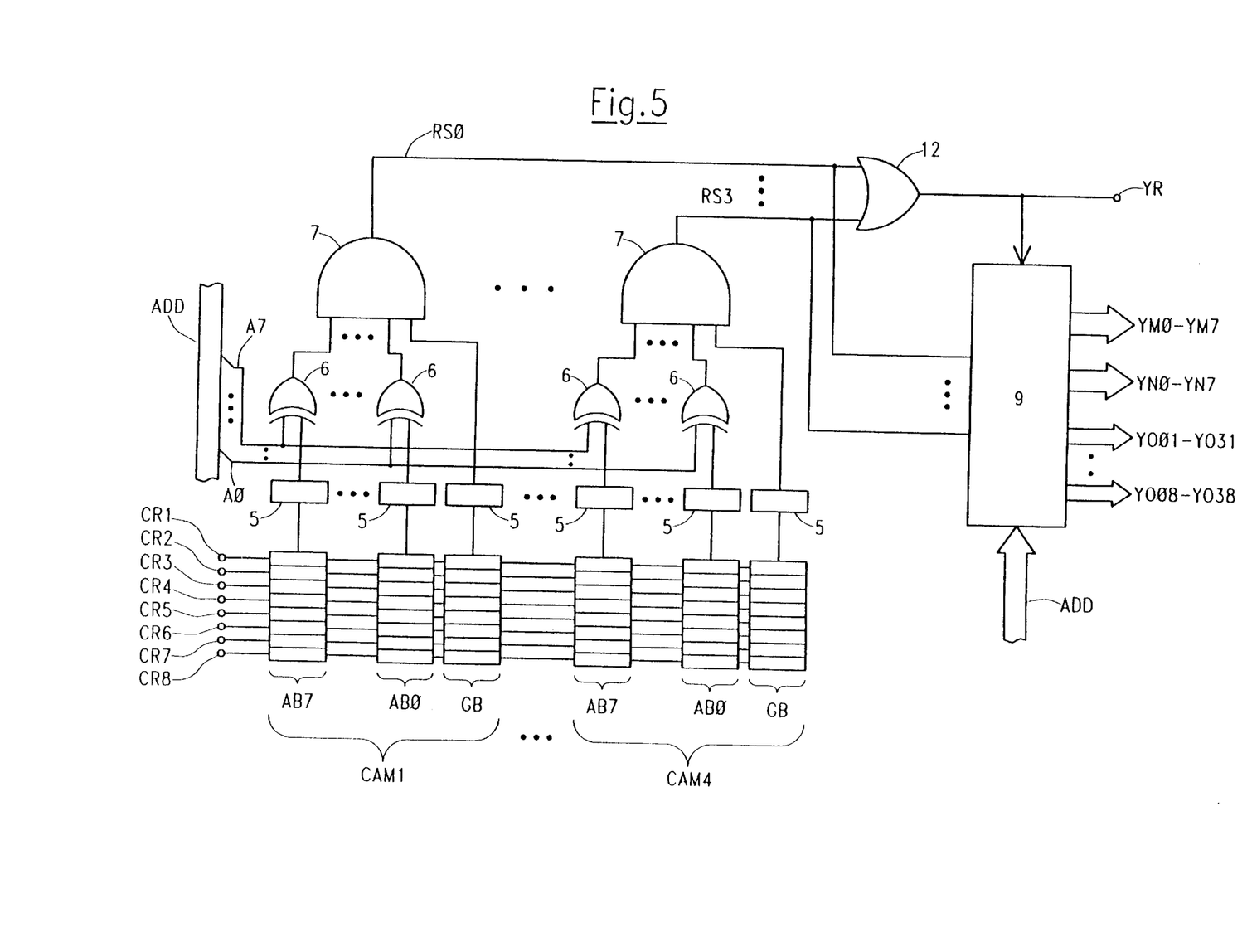
FIG. 5 shows a redundancy control circuit of the Flash EEPROM shown in FIG. 1.

FIG. 5 schematically shows a redundancy control circuit integrated in the Flash EEPROM. The circuit comprises a Content Addressable Memory (CAM) comprising four memory banks CAM1–CAM4. The first memory bank CAM1 is associated with the redundancy bit line BLR0 in each portion Di of each memory sector Sk; similarly, the second, third and fourth memory banks CAM2–CAM4 are associated with the redundancy bit lines BLR1–BLR3, respectively. Each memory bank CAM1–CAM4 comprises eight CAM rows (CAM memory locations), individually addressable by means of eight respective CAM row selection signals CR1–CR8. Each CAM row comprises nine memory elements: the first eight memory elements AB0–AB7 are capable of storing an eight-bit digital code corresponding to an address of a defective bit line among the 256 bit lines BL0–BL255 of a portion Di of memory sector, while the ninth memory element GB (so-called "guard bit") is programmed to signal that a defective bit line address is stored in the memory elements AB0–AB7. Each CAM row is associated with a respective memory sector: for example, the first CAM row of each memory bank CAM1–CAM4 is associated with the first memory sector S1, and so on; as will be better explained in the following, a given CAM row is read when the correspondent memory sector is addressed. In this way, if the currently addressed bit line of the currently addressed memory sector is a defective bit line, it is possible to substitute the defective bit line with a redundancy bit line belonging to the addressed memory sector; bit lines belonging to other memory sectors but having the same address as the defective bit line are not replaced by redundancy bit lines; this permits to repair a higher number of defects.

Each one of the nine memory elements AB0–AB7 and GB in each memory bank CAM1–CAM4 is associated with a respective sensing circuit 5 for reading the content of the respective memory element; more precisely, all the memory elements AB0, belonging to the eight CAM rows, are associated with a unique sensing circuit 5, and the same holds true for the other memory elements AB1–AB7 and GB. The output of each sensing circuit 5, except from the output of the sensing circuit 5 associated with the guard bits GB, supplies a respective two-inputs EXOR gate 6 whose other input is a respective address signal A0–A7 of an address signal bus ADD; A0–A7 carry the current column address signal. Each EXOR gate 6 compares the content of the respective memory element AB0–AB7 of the associated CAM bank with the logic state of one of the column address signals A0–A7. The outputs of the EXOR gates 6 and the output of the sensing circuit 5 associated with the guard bit GB are supplied to a nine-input AND gate 7 whose output RS0–RS3 supplies, together with the outputs of the other three AND gates 7 associated with the remaining three CAM memory banks CAM2 . . . CAM4, the column decoding circuit 9 and a four-inputs OR gate 12. An output of the OR gate 12 forms the second-level redundancy selection signal YR, and also supplies the column decoding circuit 9. The output of a given AND gate 7 is high only when the digital code stored in the memory elements AB0–AB7 of the selected CAM row coincides with the current logic configuration of the column address signals A0–A7, and when the guard bit GB of the selected CAM row is programmed.

Circuits 5, 6 and 7 form altogether a circuit for recognizing if the address currently supplied to the memory device coincides with a defective address stored in the CAM memory.

Figures 6, 7, 8:
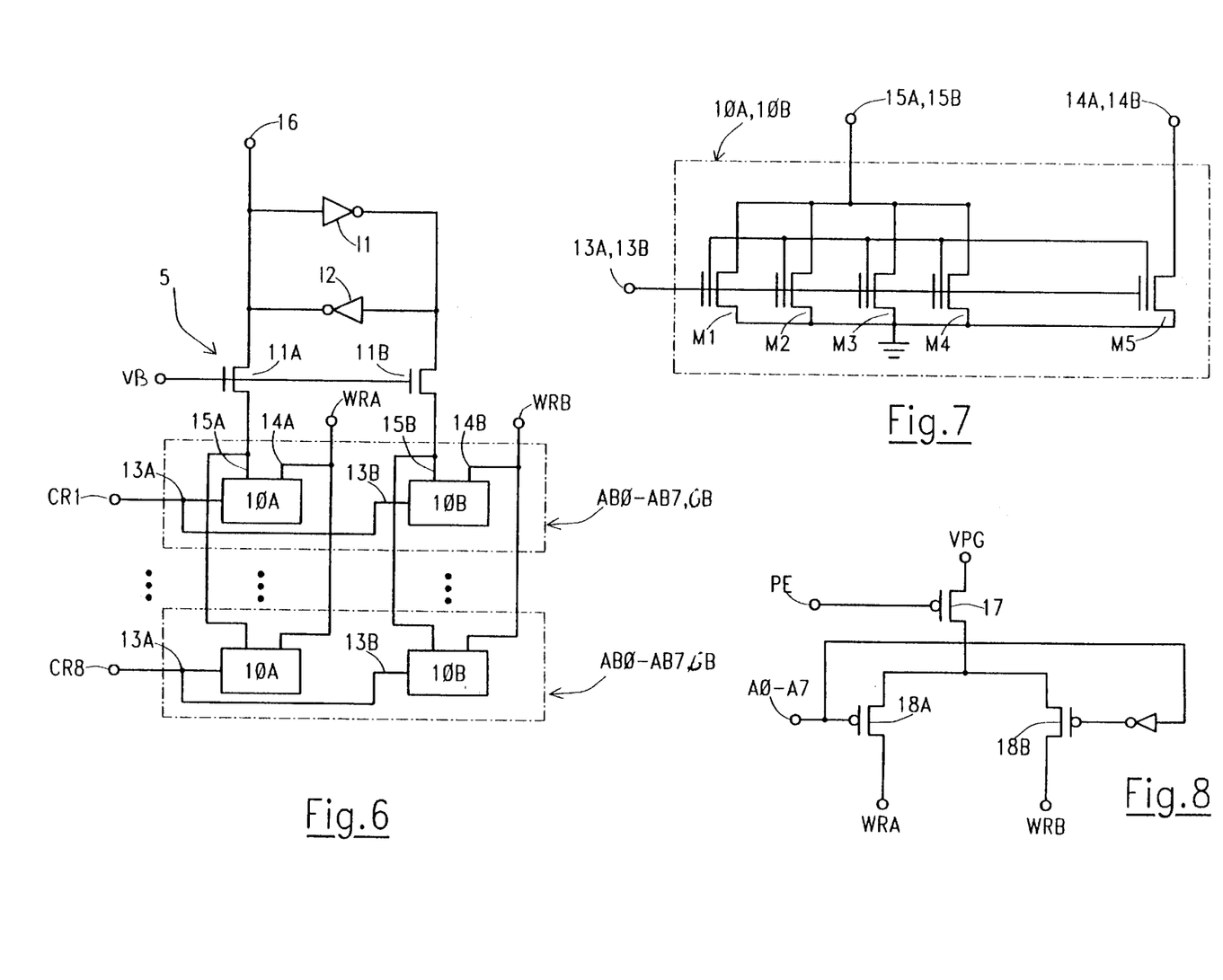
FIG. 6 shows a detail of the redundancy control circuit of FIG. 5.
FIG. 7 shows a memory cell of the redundancy control circuit.
FIG. 8 shows a programming circuit for the memory cell of FIG. 7.

FIG. 6 shows in detail the structure of one of the memory elements AB0–AB7 or GB, and of the respective sensing circuit 5. As visible, each memory element AB0–AB7 or GB comprises two memory cells 10A, 10B having a control input 13A, 13B supplied with a respective one of the CAM row selection signals CR1–CR8, a programming input 14A, 14B supplied with a programming voltage WRA, WRB, and a read output 15A, 15B supplying the sensing circuit 5. The read outputs 15A, 15B of memory cells 10A, 10B are coupled, through respective voltage-limiting transistors 11A, 11B, to respective inputs of a bistable latch comprising two inverters I1, I2. An output 16 of the latch is supplied to the respective EXOR gate 6 or, in the case of the guard bits GB, directly to the respective AND gate 7. The gate electrodes of voltage-limiting transistors 11A, 11B are biased by a bias voltage VB of approximately 2 V which limits the voltage on the read output 15A, 15B of the memory cells at approximately 1 V, to prevent soft-writing errors.

FIG. 7 is a detailed circuit diagram of one of the memory cells 10A, 10B. The memory cell comprises five floating-gate MOS transistors M1–M5. The first four floating-gate MOS transistors M1–M4 are parallely connected, having a source electrode connected to ground, a drain electrode connected to the read output 15A, 15B, and a control gate electrode connected to the control input 13A, 13B of the memory cell 10A, 10B; the fifth floating-gate MOS transistor has a source electrode connected to ground, a drain electrode connected to the programming input 14A, 14B and a control-gate electrode connected to the control input 13A, 13B of the memory cell 10A, 10B. The five transistors M1–M5 have floating gates short-circuited to each other. The first four floating-gate MOS transistors M1–M4 are simultaneously activated during reading of the memory cell 10, 10B to provide a high sensing current, while the fifth floating-gate MOS transistor is used during programming of the memory cell 10A, 10B; since the five transistors M1–M5 have floating gates short-circuited to each other, the hot-electron current generated in the channel of M5 programs all the five transistors M1–M5 simultaneously. The programming current required to program the memory cell is substantially equal to that of a single floating-gate MOS transistor, but the sensing current is approximately equal to four times the sensing current of a single floating-gate MOS transistor in the same biasing conditions.

FIG. 8 is a circuit schematic of a programming circuit for programming the memory cells 10A, 10B of a memory element AB0–AB7. The programming circuit comprises a P-channel MOSFET controlled by a program enable signal PE to enable the supply of a programming voltage VPG (approximately 5–6 V) to two other P-channel MOSFETs 18A, 18B. MOSFET 18A is controlled by one of the column address signals A0–A7, while MOSFET 18B is controlled by the complement of said column address signal A0–A7. The drain of MOSFET 18A is connected to the programming input 14A of the memory cell 10A, while the drain of MOSFET 18B is connected to the programming input 14B of the memory cell 10B.

Figure 9:
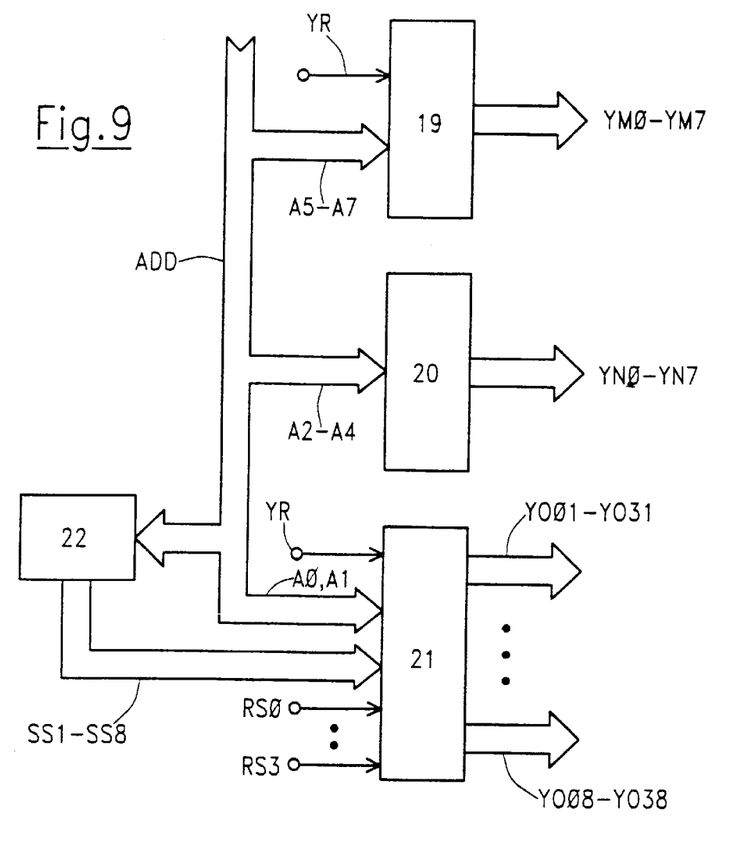
FIG. 9 is a schematic diagram of a circuit for generating column selection signals.

FIG. 9 schematically shows the structure of the column decoding circuit 9. The circuit comprises a first decoder 19 supplied with the column address signals A5–A7 and generating the eight third-level selection signals YM0–YM7; depending on the particular logic configuration of the address signals A5–A7, only one of the third-level selection signals YM0–YM7 is activated. The first decoder 19 is also supplied with the signal YR to inhibit the activation of anyone of the third-level selection signals YM0–YM7, independently of the state of the address signals A5–A7, when the signal YR is active. A second decoder 20 is supplied with the column address signals A2–A4 and generates the eight second-level selection signals YN0–YN7: only one of these signals YN0–YN7 is activated, depending on the state of the address signals A2–A4. A third decoder 21 is supplied with the remaining column address signals A0, A1 and with eight memory sector selection signals SS1–SS8, and generates the eight groups of first-level selection signals Y00k–Y03k (k=1 . . . 8). The sector selection signals SS1–SS8 are generated by another decoder 22, also supplied by the address signal bus ADD, and according to the particular logic configuration of the address signals ADD one of the sector selection signals SS$\underline{k}$ (k=1 . . . 8) is activated. The activation of a given one of signals SSk allows the activation of a respective one of the four signals Y00$\underline{k}$–Y03$\underline{k}$ of the group $\underline{k}$, according to the configuration of the address signals A0, A1; all the other first-level selection signals of the other groups Y00$\underline{k}$–Y03$\underline{k}$ are not activated. The third decoder 21 is also supplied with the signal YR and with the redundancy selection signals RS0–RS3: when the signal YR is active, the activation of one of the first-level selection signals Y00k–Y03k corresponding to the selected sector k does not depend on the address signals A0, A1, but on the signals RS0–RS3, respectively.

It is to be noted that, in one embodiment, when in a given portion Di of a given memory sector a defective bit line is replaced by one of the four redundancy bit lines RBL0–RBL3 associated with said portion Di, the same substitution takes place for all the bit lines belonging to the other portions of the same memory sector, but having the same address of the defective bit line; in other words, redundancy of a defective bit line is not independent from the portion Di in which the defective bit line is found, for this embodiment.

In an alternative embodiment, the redundancy of the defective bit is independent for each portion Di and the proper number of memory cells CAM are provided to permit their independent substitution for particular bit lines within distinct portions Di.

Figure 10:
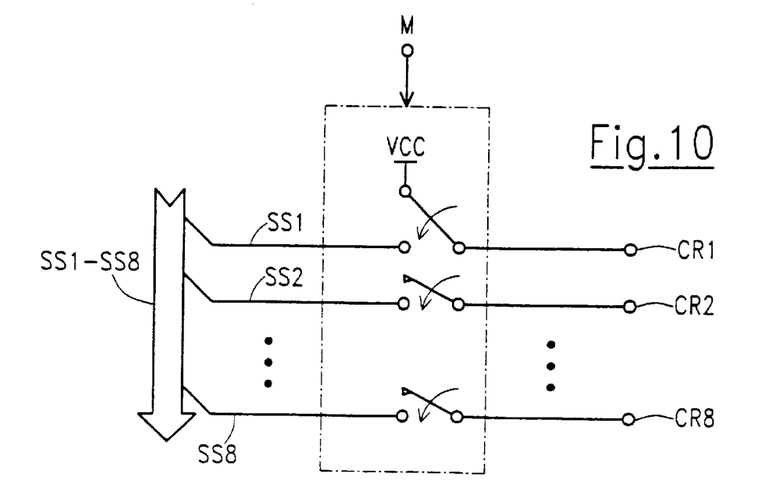
FIG. 10 schematically shows a circuit for selecting one of two redundancy operation modes.

FIG. 10 schematically shows a circuit for selecting a redundancy operation mode for the Flash EEPROM. One two operation modes is selected by a signal M. In a first redundancy mode, access to all the eight CAM rows of the four CAM memory banks CAM1–CAM4 is enabled: the CAM row selection signal CR1 corresponds to the sector selection signals S1, CR2 corresponds to SS2, and so on. When the currently addressed sector is S1, the first CAM row is addressed, when the currently addressed sector is SZ the second CAM row is addressed, and so on. In this redundancy mode, the 256 redundancy bit lines provided in the memory device allow to repair a maximum of 32 defective bit lines, provided that no more than four defective bit lines exist in each memory sector. This is made possible because all the eight memory locations of each CAM memory bank CAM1–CAM4 are employed, so that four defective bit line addresses per each memory sector can be stored in the CAM memory: a defective bit line in a given memory sector can be replaced without causing such replacement to take place in the other sectors.

In a second redundancy mode, only the first CAM row of the four CAM memory banks can be accessed: only four defective bit line addresses can be stored in the CAM memory. In this redundancy mode, the 256 redundancy bit lines provided in the memory device allow to repair a maximum of four defective bit lines, wherever they are found. When a defective bit line of a given memory sector is replaced by a redundancy bit line belonging to said memory sector, the same substitution takes place for all the bit lines belonging to the other memory sectors but having the same address of the defective bit line. In other words, it is not possible to use the redundancy bit lines of a given sector independently from those of the other sectors in this second mode.

The selection of one of the two redundancy modes takes place during the in-factory testing of the memory device. The first redundancy mode, even if it allows a higher number of defects to be repaired, causes a lengthening of the read access time of the memory device: in fact, when a transition of addresses takes place from a defective bit line in a given memory sector to another defective bit line in another memory sector, it is necessary to wait the settling of the sensing circuits 5 of the redundancy control circuit; that is, reading of the content of the CAM memory locations is performed dynamically. The second redundancy mode does not show this drawbacks, because since the CAM memory location never change, their content is read at the power-up of the memory device, and it is necessary to wait for the sensing circuits 5 of the redundancy control circuit to settle only at the power-up.

The choice of either one of the two redundancy modes depends on the number of defective bit lines found in the memory device: if this number is higher than four, the first redundancy mode will be enabled, while if this number is lower or equal to four, the second redundancy mode will be selected.

The redundancy control circuit according to the present invention, when it is operated in the first redundancy mode, allows to repair up to 32 defective bit lines even if the area occupied by the redundancy control circuit in the memory device chip is substantially equal to the area which would be occupied by a redundancy control circuit capable of repairing only 4 defective bit lines.

In fact, in the redundancy control circuit of the present invention, only four circuits for recognizing the coincidence between the current address supplied to the memory device and a defective address are provided (the four groups of circuits 5, 6 and 7 associated with each CAM memory bank CAM1–CAM4). This saving of chip area is made possible thanks to the use of a CAM memory to store the defective addresses. In a conventional redundancy control circuit, each group of circuits 5, 6 and 7 would be associated with a single respective memory register capable of storing only one defective address; in the redundancy control circuit according to the present invention, instead, each group of circuits 5, 6 and 7 is associated with eight CAM memory rows each one capable of storing a defective address: this means that each group of circuits 5, 6 and 7 can recognize eight defective addresses, instead of a single one. The only drawback is represented by a slight increase in the read access time of the memory device, because sensing of the content of the CAM memory is performed dynamically each time the addressed sector changes; however, if the conventional prior art architecture were used, a chip area eight time larger would be necessary to provide this same result as obtained by the invention.

We claim:

1. A sectorized electrically erasable and programmable non-volatile memory device comprising:

a plurality of individually-addressable memory sectors, each memory sector having an array of memory cells arranged in rows and columns, the array having redundancy columns of redundancy memory cells for replacing defective columns of memory cells;

a redundancy control circuit for storing addresses of the defective columns and activating respective redundancy columns when said defective columns are addressed, said redundancy control circuit comprising at least one memory means having individually addressable memory locations each one associated with a respective memory sector for storing, individually for each memory sector, an address of a defective column belonging to the memory sector; and address recognition means associated with said memory means for recognizing if a current address supplied to the memory device coincides with a defective column address stored in an addressed one of said memory locations associated with a currently addressed memory sector.

2. Memory device according to claim 1 wherein said at least one memory means is a bank of a content addressable memory.

3. Memory device according to claim 2, further comprising:
   means for individually addressing one of said memory locations of the at least one memory means when the associated memory sector is addressed.

4. Memory device according to claim 3 wherein said address recognition means comprises sensing means for reading the defective column address stored in an addressed one of said memory locations of the memory means and comparator means supplied by said sensing means for comparing the current address supplied to the memory device with the defective column address stored in the addressed memory location of said memory means.

5. Memory device according to claim 1 wherein said address recognition means comprises means for activating a respective redundancy selection signal associated with the memory means when a content of an addressed memory location of the memory means coincides with the current address supplied to the memory device, the redundancy selection signal controlling the selection of the at least one redundancy column within the addressed memory sector.

6. Memory device according to claim 5 wherein each memory sector comprises a plurality of respective redundancy columns, and in that said redundancy control circuit comprises a respective plurality of said memory means each one associated with a respective redundancy column in each memory sector, and a respective plurality of address recognition means each one associated with a respective memory means.

7. Memory device according to claim 6 wherein each memory means of said plurality of memory means is a bank of a content addressable memory.

8. A sectorized electrically erasable and programmable non-volatile memory device comprising:
   a plurality of individually-addressable memory sectors, each memory sector having an array of memory cells arranged in rows and columns, the array having redundancy columns of redundancy memory cells for replacing defective columns of memory cells;
   a redundancy control circuit for storing addresses of the defective columns and activating respective redundancy columns when said defective columns are addressed, said redundancy control circuit comprising at least one memory means having individually addressable memory locations each one associated with a respective memory sector for storing, individually for each memory sector, an address of a defective column belonging to the memory sector, wherein said redundancy control circuit comprises redundancy mode selection means for selecting one of two redundancy modes, a first redundancy mode allowing all the memory locations of each of said plurality of memory means to be individually addressable when the corresponding memory sector is addressed, so that each memory location can store an address of a defective column belonging to the memory sector associated with said memory location independently from the addresses of defective columns belonging to other memory sectors stored in the other memory locations of said memory means, a second redundancy mode allowing only one memory location of each of said plurality of memory means to be addressable for storing an address of a defective column of any one of the memory sectors; and
   address recognition means associated with said memory means for recognizing if a current address supplied to the memory device coincides with a defective column address stored in an addressed one of said memory locations associated with a currently addressed memory sector.

9. Memory device according to claim 8 wherein each memory location of each of said plurality of memory means comprises a plurality of memory elements comprising a number of address memory elements corresponding to a number of column address signals of the memory device, and a further memory element signaling that an address of a defective column is stored in the address memory elements of said memory location.

10. Memory device according to claim 1 wherein each memory element comprises two memory cells suitable to be programmed in complementary states, each memory cell having a control input, a program input and a read output.

11. A sectorized electrically erasable and programmable non-volatile memory device comprising:
   a plurality of individually-addressable memory sectors, each memory sector having an array of memory cells arranged in rows and columns, the array having redundancy columns of redundancy memory cells for replacing defective columns of memory cells, wherein each of said memory cells comprises at least one program floating-gate MOS transistor and a plurality of parallel-connected read floating-gate MOS transistors, the program transistor having a program input coupled to said program input of the memory cell and a control input coupled, together with the control inputs of the read transistors, to the control input of the memory cell, the read transistors having a read output coupled to a read output of the memory cell, the program transistor having a floating-gate electrically connected to floating-gates of the read transistors;
   a redundancy control circuit for storing addresses of the defective columns and activating respective redundancy columns when said defective columns are addressed, said redundancy control circuit comprising at least one memory means having individually addressable memory locations each one associated with a respective memory sector for storing, individually for each memory sector, an address of a defective column belonging to the memory sector; and
   address recognition means associated with said memory means for recognizing if a current address supplied to the memory device coincides with a defective column address stored in an addressed one of said memory locations associated with a currently addressed memory sector.

12. Memory device according to claim 1 wherein the redundancy control circuit comprises a program circuit for programming the memory cells of the memory elements of each memory location of the memory means.

13. Memory device according to claim 1 wherein said program circuit comprises means for selectively coupling the program input of each memory cell to a programming voltage according to a logic state of a column address signal associated with said memory element.

14. Memory device according to claim 1, further comprising:

column selection means for selecting one column belonging to a currently addressed memory sector, and redundancy column selection means for selecting one redundancy column belonging to the currently addressed memory sector in alternative to a defective column belonging to the addressed memory sector, an address of said defective column being stored in a memory location associated with the addressed memory sector of said memory means.

15. Memory device according to claim 14 wherein within each memory sector said columns are grouped together in groups of columns coupled to respective second-level columns common to all the memory sectors, and in that within each memory sector the redundancy columns are coupled to a second-level redundancy column common to all the memory sectors.

16. A sectorized electrically erasable and programmable non-volatile memory device comprising:

a plurality of individually-addressable memory sectors, each memory sector having an array of memory cells arranged in rows and columns, the array having redundancy columns of redundancy memory cells for replacing defective columns of memory cells;

a redundancy control circuit for storing addresses of the defective columns and activating respective redundancy columns when said defective columns are addressed, said redundancy control circuit comprising at least one memory means having individually addressable memory locations each one associated with a respective memory sector for storing, individually for each memory sector, an address of a defective column belonging to the memory sector;

address recognition means associated with said memory means for recognizing if a current address supplied to the memory device coincides with a defective column address stored in an addressed one of said memory locations associated with a currently addressed memory sector; and column selection means for selecting one column belonging to a currently addressed memory sector, and redundancy column selection means for selecting one redundancy column belonging to the currently addressed memory sector in alternative to a defective column belonging to the addressed memory sector, an address of said defective column being stored in a memory location associated with the addressed memory sector of said memory means, wherein within each memory sector said columns are grouped together in groups of columns coupled to respective second-level columns common to all the memory sectors, and within each memory sector the redundancy columns are coupled to a second-level redundancy column common to all the memory sectors, and wherein said column selection means comprises first-level selection means associated with each memory sector for selectively coupling one column for each group of columns to the respective second-level column, and second-level-column selection means common to all the memory sectors for selecting one of the second-level columns, and in that said redundancy column selection means comprises first-level redundancy selection means associated with each memory sector for selectively coupling one redundancy column to the second-level redundancy column, and second-level redundancy selection means common to all the memory sectors for selecting the second-level redundancy column in alternative to the second-level columns.

17. Memory device according to claim 1 wherein said redundancy control circuit controls the activation of said first-level redundancy selection means and of said second-level redundancy selection means, and prevents the activation of said second-level-column selection means when a defective column is addressed.

18. Memory device according to claim 1 wherein the redundancy control circuit comprises means for activating said second-level redundancy selection means when at least one of the redundancy selection signals associated with each memory means is activated, said redundancy selection signals activating the first-level redundancy selection means and preventing the activation of said second-level-column selection means when activated.

19. Memory device according to claim 1 wherein said columns within each memory sector are physically formed by strips of a first-level interconnection layer and said second-level columns common to all the memory sectors are physically formed by strips of a second-level interconnection layer, and in that said redundancy columns within each memory sector are physically formed by strips of the first-level interconnection layer, and said second-level columns and second-level redundancy column common to all the memory sectors are physically formed by strips of the second-level interconnection layer.

20. A sectorized electrically erasable and programmable non-volatile memory device comprising:

a plurality of individually-addressable memory sectors, each memory sector having an array of memory cells arranged in rows and columns, the array having a redundancy column of redundancy memory cells for replacing a defective column of memory cells; and a redundancy control circuit for storing an address of the defective column and activating the redundancy column when said defective column is addressed, said redundancy control circuit including individually addressable memory locations each one associated with a respective memory sector for storing, individually for each memory sector, an address of a defective column belonging to the memory sector.

21. The memory device according to claim 20, further comprising a sensor structured to read the defective column address stored in an addressed one of said memory locations of the redundancy control circuit and a comparator coupled to said sensor, the comparator being structured to compare the current address supplied to the memory device with the defective column address stored in the addressed memory location of said redundancy control circuit.

* * * * *